United States Patent
Wehn et al.

(10) Patent No.: US 7,774,674 B2
(45) Date of Patent: *Aug. 10, 2010

(54) LDPC DECODER FOR DVB-S2 DECODING

(75) Inventors: Norbert Wehn, Queidersbach (DE); Frank Kienle, Kirrweiler (DE); Torben Brack, Kaiserslautern (DE)

(73) Assignee: Stmicroelectronics N.V., Amsterdam (NL)

( * ) Notice: Subject to any disclaimer, the term of this patent is extended or adjusted under 35 U.S.C. 154(b) by 1043 days.

This patent is subject to a terminal disclaimer.

(21) Appl. No.: 11/366,167

(22) Filed: Mar. 2, 2006

(65) Prior Publication Data

US 2006/0206778 A1    Sep. 14, 2006

(30) Foreign Application Priority Data

Mar. 2, 2005    (EP)    ................................... 05290468

(51) Int. Cl.
*H03M 13/00*    (2006.01)
(52) U.S. Cl. .................. 714/752; 714/805; 377/54; 377/67; 377/69; 365/185.11; 709/242
(58) Field of Classification Search ................ 714/752, 714/805; 377/54, 67, 69; 365/185.11; 709/242
See application file for complete search history.

(56) References Cited

U.S. PATENT DOCUMENTS

| | | | | |
|---|---|---|---|---|
| 5,182,805 A | * | 1/1993 | Campbell | ................... 711/163 |
| 5,193,175 A | * | 3/1993 | Cutts et al. | .................... 714/11 |
| 5,761,719 A | * | 6/1998 | Mahin et al. | ................. 711/139 |
| 6,633,856 B2 | * | 10/2003 | Richardson et al. | ........... 706/15 |
| 7,137,060 B2 | * | 11/2006 | Yu et al. | ...................... 714/794 |
| 2005/0149844 A1 | * | 7/2005 | Tran et al. | ................... 714/800 |
| 2005/0278514 A1 | * | 12/2005 | Wilson | ........................ 712/234 |

OTHER PUBLICATIONS

Xiaofu Wu, Yingjian Xue and Haige Xiang, On Concatenated Zigzag Codes and their Decoding Schemes, Jan. 2004, IEEE, vol. 8, p. 54-56.*

Eroz, M, Impact of near Shannon -Limit codes on wireless communications technology, 2004, IEEE, vol. 1, p. 255-256.*

Urard et al., "A 135Mb/s DVB-S2 Compliant Codec Based on 64800b LDPC and BCH Codes", Solid State Circuits Conference, 2005—IEEE International, San Francisco, CA; Feb. 6-10, 2005, pp. 446-448, XP 010830898; ISBN: 0-7803-8904-2.

(Continued)

*Primary Examiner*—Scott T Baderman
*Assistant Examiner*—Enam Ahmed
(74) *Attorney, Agent, or Firm*—Lisa K. Jorgenson; Allen, Dyer, Doppelt, Milbrath & Gilchrist, P.A.

(57) ABSTRACT

The LDPC decoder includes a processor for updating messages exchanged iteratively between variable nodes and check nodes of a bipartite graph of the LDPC code. The decoder architecture is a partly parallel architecture clocked by a clock signal. The processor includes P processing units. First variable nodes and check nodes are mapped on the P processing units according to two orthogonal directions. The decoder includes P main memory banks assigned to the P processing units for storing all the messages iteratively exchanged between the first variable nodes and the check nodes. Each main memory bank includes at least two single port memory partitions and one buffer the decoder also includes a shuffling network and a shift memory.

21 Claims, 8 Drawing Sheets

OTHER PUBLICATIONS

Urard et al., "A Generic 350Mb/s Turbo-Codec Based on a 16 States SISO Decoder", Solid State Circuits Conference, 2004—IEEE International, San Francisco, CA; Feb. 15-19, 2004, pp. 424-433, XP 010722334; ISBN: 0-7803-8267-6.

Kienle et al., "Efficient Hardware Realization of IRA Code Decoders", IEEE Workshop on Austin, Texas, Oct. 13-15, 2004, p. 286-291, XP010743975; ISBN: 0-7803-8504-7.

Kienle et al., "A Synthesizable IP Core for DVB-S2 LDPC Code Decoding", Proceedings, Munich, Germany, Mar. 7-11, 2005, pp. 100-105; XP010780248; ISBN: 0-7695-2288-2.

Digital Video Broadcasting (DVB); Second Generation Framing Structure, Channel Coding and Modulation Systems for Broadcasting, Interactive Services, News Gathering and Other Broadband Satellite Applications; European Telecommunications Standards Institute, Sophia-Antipo, France, vol. BC, No. V111, Jun. 2004; Draft ETSI EN 302 307; XP014015373; ISSN: 0000-0001.

* cited by examiner

FIG.2 (PRIOR ART)

| Rate | j | f_j | f_3 | k | N | K |
|---|---|---|---|---|---|---|
| 1/4 | 12 | 5400 | 10800 | 4 | 49600 | 16200 |
| 1/3 | 12 | 7200 | 14400 | 5 | 43200 | 21600 |
| 2/5 | 12 | 8640 | 17280 | 6 | 38880 | 25920 |
| 1/2 | 8 | 12960 | 19440 | 7 | 32400 | 32400 |
| 3/5 | 12 | 12960 | 25920 | 11 | 25920 | 38880 |
| 2/3 | 13 | 4320 | 38880 | 10 | 21600 | 43200 |
| 3/4 | 12 | 5400 | 43200 | 14 | 16200 | 48600 |
| 4/5 | 11 | 6480 | 45360 | 18 | 12960 | 51840 |
| 5/6 | 13 | 5400 | 48600 | 22 | 10800 | 54000 |
| 8/9 | 4 | 7200 | 50400 | 27 | 7200 | 57600 |
| 9/10 | 4 | 6480 | 51840 | 30 | 6480 | 58320 |

FIG.4 (PRIOR ART)

| Rate | q | $E_{PN}$ | $E_{IN}$ | Addr |
|---|---|---|---|---|
| 1/4 | 135 | 97199 | 97200 | 270 |
| 1/3 | 120 | 86399 | 129600 | 360 |
| 2/5 | 108 | 77759 | 155520 | 432 |
| 1/2 | 90 | 64799 | 162000 | 450 |
| 3/5 | 72 | 51839 | 233280 | 648 |
| 2/3 | 60 | 43199 | 172800 | 480 |
| 3/4 | 45 | 32399 | 194400 | 540 |
| 4/5 | 36 | 25919 | 207360 | 576 |
| 5/6 | 30 | 21599 | 216000 | 600 |
| 8/9 | 20 | 14399 | 180000 | 500 |
| 9/10 | 18 | 12959 | 181440 | 504 |

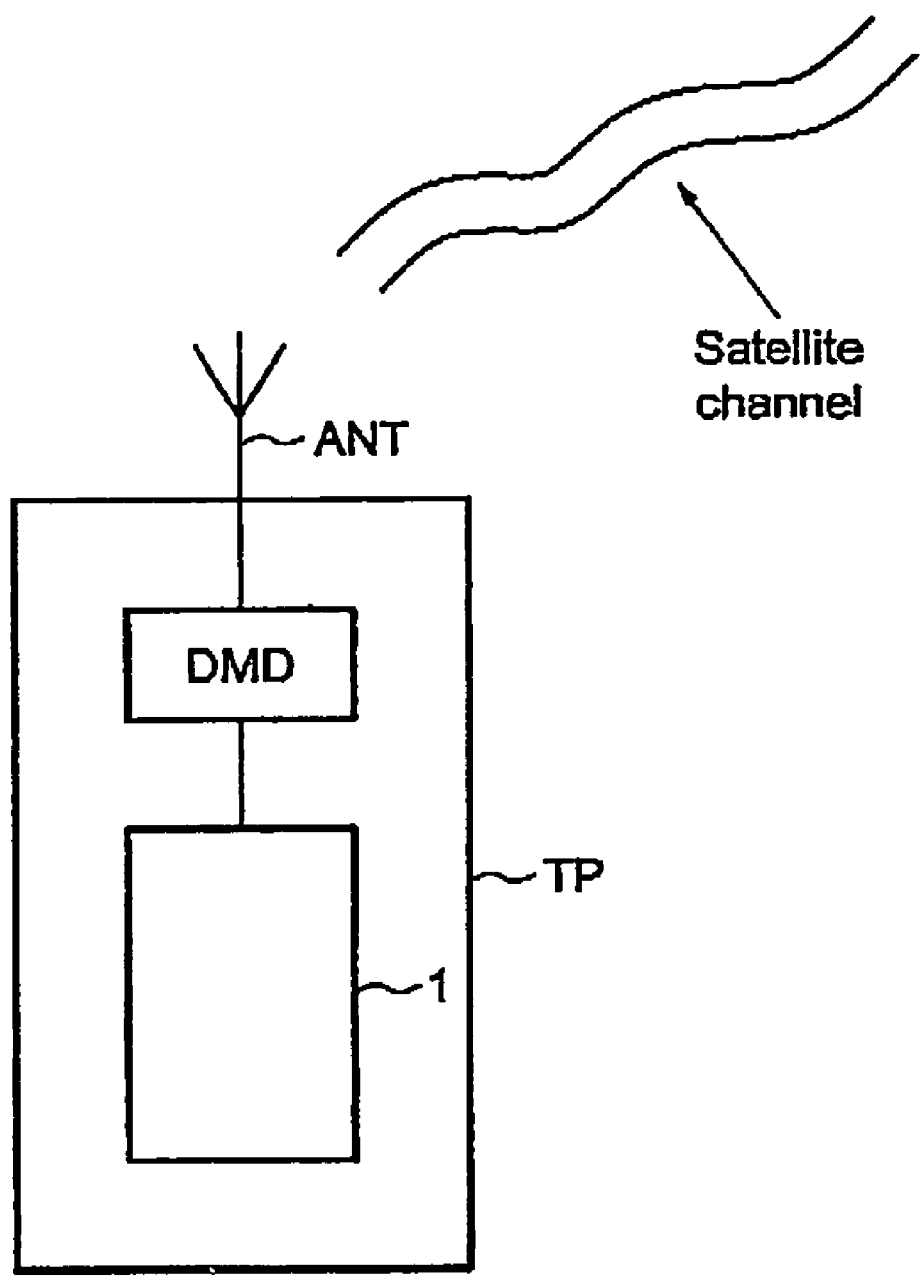

LDPC DECODER FOR DVB-S2 DECODING

FIELD OF THE INVENTION

The present invention is generally directed to the field of data communication, and more specifically to a decoder for decoding codewords encoded with a Low-Density Parity-Check (LDPC) code. The invention is more particularly, but not exclusively, directed to data communication systems utilizing Irregular Repeat Accumulate (IRA) codes, and more specifically the Digital Video Broadcast (DVB-S2) standard.

BACKGROUND OF THE INVENTION

LDPC codes were introduced by Gallager in 1962 and rediscovered in 1996 by Mac Kay and Neal. For a long time they had no practical impact due to their computational and implementation complexity. This changed with advances in microelectronics that led to more computational power at hand for simulation and which now enables implementation. Due to their excellent error correction performance they are considered for future telecommunication standards.

An LDPC code is a linear block code defined by its sparse M×N parity check matrix H. It contains j ones per column and k ones per row, called row and column degree respectively. A (j,k)-regular LDPC code has row and column degree of uniform weight, otherwise the code is called irregular. A parity check code can be represented by a bipartite graph also called Tanner graph. The M check nodes correspond to the parity constraints, the N variable nodes represent the data symbols of the codeword. An edge in the graph corresponds to a one in the parity check matrix.

In the LDPC code encoder the packet to encode of size (N−M) is multiplied with a generator matrix G of size (N−M)×N. This multiplication leads to an encoded vector of length N. The generator matrix G and the parity check matrix H satisfy the relation $GH^t=0$ where 0 is the null matrix.

Generally speaking a LDPC code decoder comprises a decoding module which receives the encoded vector of length N and delivers an intermediate vector of length N by using the parity check matrix H. Then a demapping module extracts from said intermediate vector the decoded vector of length (N−M). More precisely LDPC codes can be decoded using message passing algorithms, either in hard or soft decision form. The decoding is then an iterative process, which exchanges messages between variable and check nodes. Typically a Belief Propagation (BP) algorithm is used, which exchanges soft-information iteratively between variable and check nodes. The code performance mainly depends on the randomness of the parity check matrix H, the codeword size N and the code rate $R=(N-M)/N$.

The channel coding part is a very important component in wireless communication systems like UMTS, WLAN and WPAN. Especially in the domain of WLAN and WPAN the latency of the decoding may be of a critical importance. Low Density Parity Check codes can be seen as a promising candidate for this kind of system in the near future. These codes are being deployed in the DVB-S2 standard and in some optical fiber communication systems. More applications will follow in the near future.

The codes have some very interesting properties, which make them a natural choice for latency critical application. The new DVB-S2 standard features a powerful forward error correction (FEC) system, which enables transmission close to the theoretical limit, and that is enabled by using LDPC codes, which can even outperform Turbo-Codes. To provide flexibility, 11 different code rates (R) ranging from R=1/4 up to R=9/10 are specified with a codeword length up to 64800 bits. This huge maximum codeword length is the reason for outstanding communication performance, so the codeword length of 64800 bits is described.

For the DVB-S2 code, 64800 so called variable nodes (VN) and 64800×(1−R) check nodes (CN) exist. The connectivity of these two types of nodes is specified in the standard. For decoding the LDPC code, messages are exchanged iteratively between these two types of nodes, while the node processing is of low complexity. Generally, within one iteration, first the variable nodes (VN) are processed, then the check nodes (CN).

For a fully parallel hardware realization, each node is instantiated and the connections between the nodes are hardwired. But even for relatively short block length like 1024 bits, severe routing congestion problems exist. Therefore, a partly parallel architecture may become mandatory for larger block length, wherein only a subset of nodes are instantiated. A network has to provide the required connectivity between variable nodes and check nodes. But realizing any permutation pattern is very costly in terms of area, delay and power.

To avoid this problem a decoder-first design approach was presented in "Decoder first code design" by E. Boutillon, J. Castura, and F. Ksschischang ($2^{nd}$ International Symposium on Turbo codes and Related Topics, pages459-462, Brest, France, September 2000). First an architecture is specified and afterwards a code is designed which fits this architecture. This approach is only suitable for regular LDPC code where each variable node has the same number of incident edges, the check nodes respectively. But for an improved communications performance so called irregular LDPC codes are mandatory, where the variable nodes are of varying degrees. This is the case for the DVB-S2 code. In "Design Methodology for IRA Codes" by F. Kienle and N. Wehn (Proc. 2004 Asia South Pacific Design Automation Conference, Yokohama, Japan, January 2004), a design method for irregular LDPC codes which can be efficiently processed by a decoder hardware is presented.

Such decoder hardware requires separate memories for mapping the information nodes and the check nodes. Generally speaking for a partly parallel LDPC decoder architecture, each message in the Tanner graph has to be stored. Due to the use of the two-phase algorithm (first the variable nodes are processed and then the check nodes), two separate RAM banks are required to store all the updated messages. Both RAM banks can be merged by using dual port RAMs, where it is possible to read one message and write another every cycle from different addresses. However using dual-port RAMs is area and power consuming.

SUMMARY OF THE INVENTION

An object of the invention is to overcome the above discussed problem while avoiding the read/write conflicts.

Another object of the invention is to reduce the memory size and the number of iterations during parity nodes updating.

According to an aspect of the invention, an LDPC decoder is provided and includes an input for receiving an encoded codeword including several digital data (each data may be also called "soft bit" which is a real value coded on several bits and corresponds to the value of the corresponding bit of the transmitted codeword actually received from the channel). The decoder also includes a processor for updating messages exchanged iteratively between variable nodes and check nodes of a bipartite graph of the LDPC code, a memory for storing the messages, and a shuffling network connected between the processor and the memory and controlled by shift values stored in a shift memory and corresponding to the connectivity between at least a subset of first variable nodes, for example information nodes, and the check nodes.

The decoder architecture is a partly parallel architecture clocked by a clock signal. The processor comprises P processing units adapted to perform iteratively a first variable nodes processing phase for updating all the messages from the first variable nodes to the check nodes, and a check nodes processing phase for updating all the messages from the check nodes to the first variable nodes. In other words, during the first variable nodes processing phase, all the first variable nodes are processed whereas all the check nodes are processed during the check nodes processing phase.

The first variable and check nodes are mapped on these P processing units according to two orthogonal directions. The input comprises P channel memories for storing all the digital data of the codeword, and the memory comprises P main memory banks assigned to the P processing units for storing all the messages iteratively exchanged between the first variable nodes and the check nodes. Each main memory bank comprises at least two single port memory partitions and one buffer.

The decoder also comprises a memory controller for reading a message from and writing the corresponding updated message into the memory at the same address taking into account the shift values, and for, within a same clock cycle and for each main memory bank, reading and writing into two different memory partitions, or reading one memory partition and writing into the buffer. The use of single port memory partitions permits to reduce area and power consumption. Further, using a RAM hierarchy within each main memory bank including at least two memory partitions and one buffer contributes, in combination with the particular mapping of the check nodes and variable nodes and with the address control performed by the memory controller, to avoid read/write conflicts.

At last, using only P main memory banks for storing all the updated messages permits an efficient area reduction by contrast with the prior art approaches which used distinct memories for storing the updated messages from the information nodes and the updated messages from the check nodes.

In a preferred embodiment, the memory controller comprises a management unit connected to the P main memory banks and adapted to receive within a clock cycle: a current reading address destined to the P main memory banks for respectively reading at the reading address P output messages; and a current writing address destined to the P main memory banks for respectively storing at the writing address P updated messages. Each of the current writing and the current reading address comprises an assignment indication to a memory partition, for example the two least significant bits of the address, and an address indication within the memory partition. Only the management unit is used to manage all the P main memory banks.

In an advantageous embodiment, the management unit comprises a comparison unit or means for comparing the current writing address and the current reading address, and a control unit or means for writing the input message into the buffer of the main memory bank and delivering the current writing address to a storing unit or means if assignment indications of both current reading and writing addresses are identical. The control unit is further adapted to write the input message from the buffer into the corresponding memory partition at the current writing address within a next clock cycle during which the corresponding memory partition is not read.

The management unit thus contributes to the fact that no read/write conflict occurs. Furthermore, the memory controller comprises means for successively incrementing the reading and writing addresses to be used in the first variable nodes processing phase and an address memory storing a predetermined addressing scheme corresponding to the writing and reading addresses to be used in the check nodes processing phase.

In a preferred embodiment, each main memory bank comprises one buffer capable of storing only one message, and four memory partitions. The first variable nodes can be mapped horizontally on the P processing units and the check nodes are mapped vertically on the P processing units. In other words, the P processing units are adapted to update all the messages in the first variable nodes processing phase, by successive groups of P messages respectively related to P consecutive first variable nodes, whereas one processing unit is adapted to update in the check nodes processing phase all the messages related to P consecutive check nodes. However, mapping the check nodes horizontally and the first variable nodes vertically would be also possible.

The variable nodes of the bipartite graph may further comprise a second subset of second variable nodes, for example parity nodes, all of degree 2, connected to the check nodes in a fixed zigzag connectivity. Although it would be possible to process the parity nodes together with the information nodes within the variable nodes processing phase, it is particularly advantageous that the P processing units be adapted to update the messages from the second variable nodes to the check nodes in the check nodes processing phase. In other words, according to this embodiment, the parity nodes are processed concurrently with the check nodes in the check nodes processing phase.

A vertical mapping of the check nodes and the zigzag connectivity permit to a processing unit to process consecutive check nodes, and so the memory requirements are reduced. Indeed, the message which is passed during a forward update of a check node is kept in the processing unit to be used for the processing of the next check node, which is the consecutive check node due to the vertical mapping. Only the messages of the backward update have to be stored.

In other words, the decoder further comprises advantageously P auxiliary memory banks assigned to the P processing units and directly connected between the outputs and the inputs of the processing units. In the check nodes processing phase each processing unit is adapted: to read at least one main memory bank and the corresponding channel memory for performing a forward update for directly updating a message from a current check node to the following check node and to store the updated message in an internal memory of the processing unit; and to read one auxiliary memory bank, the corresponding channel memory and at least one main memory bank for performing a backward update of a message from a second variable node to the preceding check node and to write the updated message in one auxiliary memory bank.

As only messages of the backward update are stored, the size of the auxiliary memory can be reduced. The digital data of the codeword and the messages are, for example, Log-Likelihood Ratios (LLR). The LDPC code is for example an Irregular Repeat-Accumulate (IRA) code, and more particularly a DVB-S2 LDPC code.

A terminal of a wireless communication system may include a decoder as previously described.

According to another aspect, a method is also proposed for decoding an LDPC encoded codeword. The LDPC code is represented by a bipartite graph between check nodes and variable nodes including first variable nodes, for example, information nodes. The method comprises mapping the variable nodes and the check nodes on a partly parallel architecture clocked by a clock signal and including P processing units which update messages exchanged iteratively between the first variable nodes and check nodes through a shuffling network controlled by shift values. Each main memory bank comprises at least two single port memory partitions and one buffer. The updating step includes reading messages to be updated from P main memory banks at reading addresses and writing the updated messages at the same addresses taking into account the shift values. Within a same clock cycle and for each main memory bank, the updating step comprises reading and writing into two different memory partitions or reading one memory partition and writing into the buffer.

Advantageously, the variable nodes further include second variable nodes, for example parity nodes of degree 2 connected to the check nodes by a zigzag connectivity. The updating step includes a first variable processing phase during which all the messages from the first variable nodes to the check nodes are updated, and a check nodes processing phase during which all the messages from the check nodes to the first variable nodes are updated, all the messages from the second variable nodes to the check nodes are further updated, and during which an updated message processed by a check node is directly passed to the next check node through the zigzag connectivity.

In a preferred embodiment, a group of consecutive check nodes are processed by a same processing unit, and the step of directly passing an updated message processed by a check node to the next check node through the zigzag connectivity comprises storing the updated message into an internal memory of the processing unit.

BRIEF DESCRIPTION OF THE DRAWINGS

Other advantages and features of the invention will appear upon examining the detailed description of embodiments, and of the appended drawings in which:

FIG. 2 is a table of parameters describing the DVB-S2 LDPC Tanner graph for different code rates in accordance with the prior art.

FIG. 4 is a table of DVB-S2 code rate dependent parameters in accordance with the prior art.

FIG. 8 is a diagram illustrating a terminal of a wireless communication system according to the invention.

DETAILED DESCRIPTION OF THE PREFERRED EMBODIMENTS

In the following description, the LDPC code is a DVB-S2 LDPC code as defined in "ETSI EN 302 307 v1.1.1 (2004-06)" defining the DVB-S2 standard, although the invention is not limited to such a code. The parity check matrix H of LDPC code is a sparse binary matrix. The set of valid codewords x has to satisfy $H^t x = 0$.

A column in H is associated to a bit of the codeword and a row corresponds to a parity check. A nonzero element in a row of H means that the corresponding bit contributes to this parity check. The code can best be described by a bipartite graph called a Tanner graph, which is a graphical representation of the associations between code bits and parity checks. Code bits are shown as variable nodes $VN_i$ (circles), and parity checks as check nodes $CN_i$ (squares), with edges connecting them. The number of edges on each node is called the node degree. If the node degree is identical, for all variable nodes, the parity check matrix H is called regular, otherwise the parity check matrix is called irregular.

Figure 1:
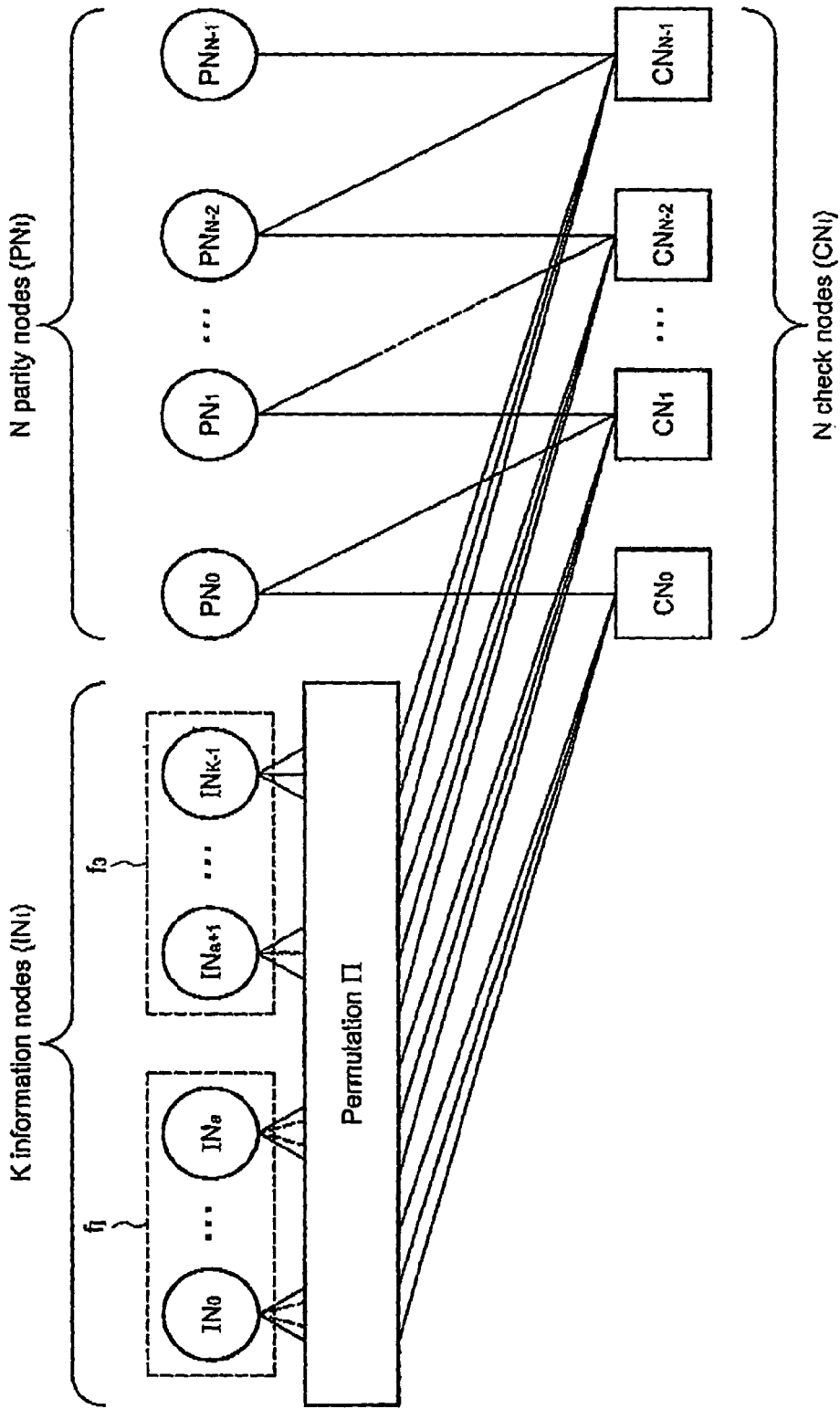
FIG. 1 is a bipartite graph illustrating a DVB-S2 LDPC code in accordance with the prior art.

The DVB-S2 parity check matrix includes two distinctive parts, a random part dedicated to the systematic information, and a fixed part that belongs to the parity information. The Tanner graph of a DVB-S2 code is illustrated in FIG. 1. Two types of variable nodes exist, a first subset of variable nodes, the information nodes $IN_i$, and a second subset of variable nodes, the parity nodes $PN_i$, respectively corresponding to the systematic and parity bits of the codeword.

The permutation Π represents the random matrix part of the connectivity between information nodes $IN_i$ and check nodes $CN_i$. The parity nodes $PN_i$ are all of degree two and are connected in a fixed zigzag pattern to the check nodes $CN_i$. The N check nodes have a constant degree k. The K information nodes include two subsets $f_j$ and $f_3$, with $f_j$ and $f_3$ respectively the number of information nodes of degree J and of degree 3. FIG. 2 summarizes the code rate dependent parameters as defined in the DVB-S2 standard, J, $f_1$, $f_3$, N, K, and k wherein k is the degree of the check nodes.

The connectivity of the information nodes and the check nodes is defined by the DVB-S2 encoding rule:

$$\begin{cases} p_j = p_j \oplus i_m \\ j = (x + q(m \bmod 360)) \bmod N \end{cases} \quad (1)$$

wherein:

$p_j$ is the $j^{th}$ parity bit;

$i_m$ is the is the $m^{th}$ information code bit; and x, q, and n are code rate dependant parameters specified by the DVB-S2 standard.

This encoding rule determines the entries of the parity check matrix. The $m^{th}$ column has nonzero elements in each row j, thus the permutation Π generates one edge between every check node $CN_m$ and information node $IN_j$. The fixed zigzag pattern connectivity between the parity nodes $PN_i$ and the check nodes $CN_i$ is defined by the encoding scheme:

$$p_j = p_j \oplus p_{j-1}, j = 1, 2, \ldots, N-1 \quad (2)$$

This is a simple accumulator. The corresponding part of the parity check matrix has two nonzero elements in each column, forming a square banded matrix. These type of LDPC codes are also called Irregular Repeat Accumulate codes (IRA codes).

LDPC codes can be decoded using a message passing algorithm. It exchanges soft-information iteratively between the variable nodes and check nodes. The exchanged messages are generally log-likelihood ratios (LLR). Each variable node of degree i calculates an update of message k according to the relation:

$$\lambda_k = \lambda_{ch} + \sum_{l=0, l \neq k}^{i-1} \lambda_l \qquad (3)$$

with $\lambda_k$ the LLR updated from the variable node, $\lambda_{ch}$ the corresponding channel LLR of the variable node, and $\lambda_l$ the LLRs of the incident edges of the variable node. The check node message updates are generally calculated according to the relation, for a message k:

$$\tanh(\lambda_k/2) = \prod_{l=0, l \neq k}^{i-1} \tanh(\lambda_l/2) \qquad (4)$$

with $\lambda_k$ the LLR updated from the check node, and $\lambda_l$ the LLRs of the incident edges of the check node.

The DVB-S2 standard supports LDPC codes ranging from code rate R equal to 1/4 to code rate R equal to 9/10. For each DVB-S2 code, the check nodes $CN_i$ and the parity nodes $PN_i$ are connected in a zigzag pattern. In other words, two successive check nodes are connected by a parity node of degree two. A variable node of degree 2 has the property that the input of the first incident edge simply added with the corresponding channel value is the output of the second incident edge, and vice versa.

Generally, in a first phase called the first variable nodes processing phase, all the information nodes are updated, whereas all check nodes are updated in a second phase called the check nodes processing phase. It is also possible to update in the first phase all the messages from the parity nodes to the check nodes and to update in the second phase all the messages from the check nodes to the parity nodes.

However, according to a preferred embodiment, from a sequential processing of the check nodes (e.g. from left to right on FIG. 1), an already updated message can directly pass to the next check node due to the simple zigzag connectivity implying a simple sum of the LLR (the updated message) with the corresponding received LLR channel value of the parity node of the zigzag configuration situated between the two consecutive check nodes. This new update scheme realized by the decoder improves the communication performance, because for decoding a codeword, about 30 iterations are sufficient instead of 40 iterations. Furthermore a size memory gain is obtained because of the avoided storage of messages directly passed to the next check node.

Figure 3:
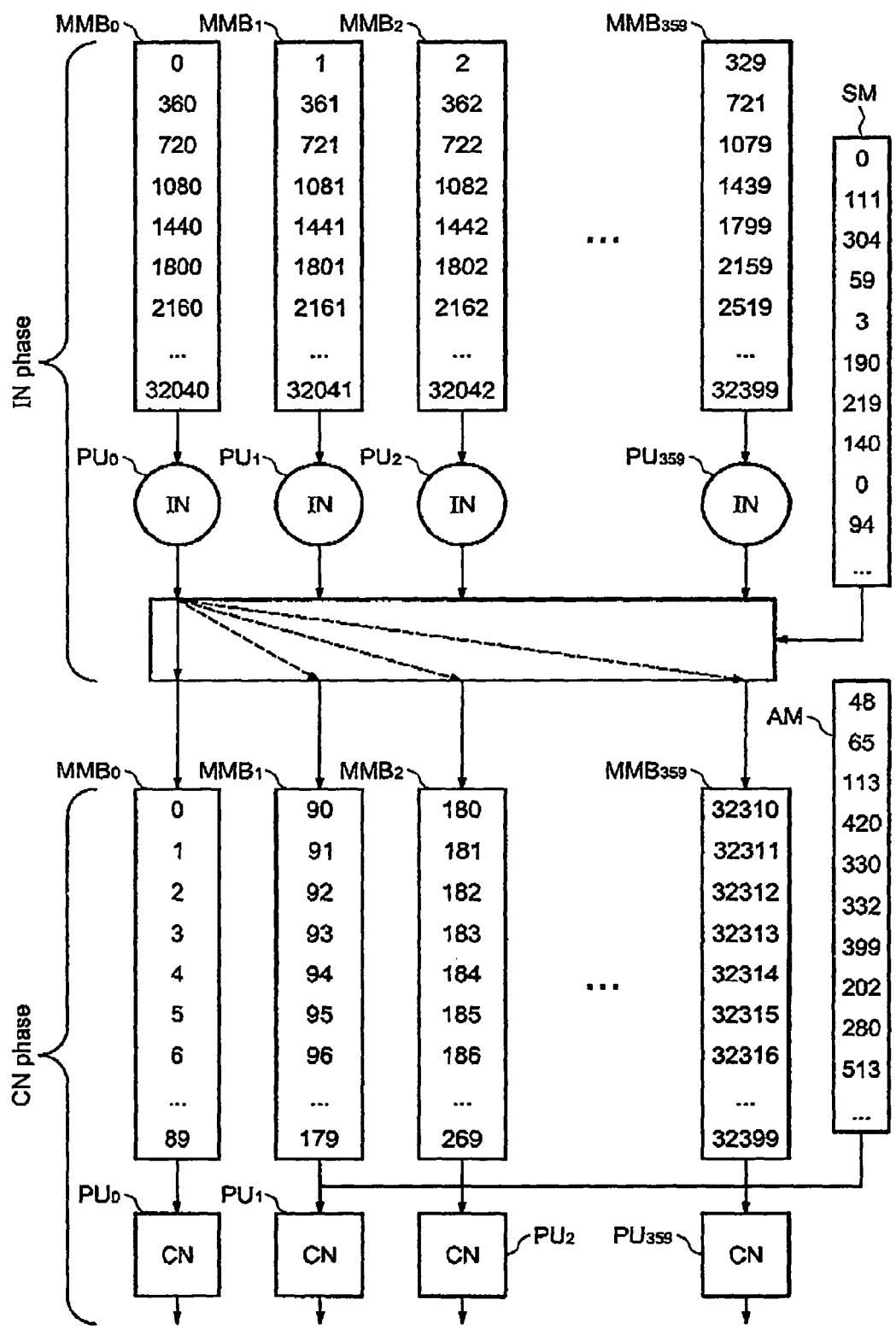
FIG. 3 is a diagram illustrating an example of the mapping of first variable nodes and check nodes on the processing units according to the invention.

FIG. 3 is an example of mapping for a code rate R=1/2. For a code rate R=1/2, the DVB-S2 code comprises 32400 parity nodes and 32400 information nodes (see FIG. 2). In FIG. 3 is represented an IN phase wherein the processing units process the information nodes $IN_i$, and a CN phase wherein the processing units process the check nodes $CN_i$. The set of edges E connecting the check nodes $CN_i$ can be split in two subsets EIN and EPN, respectively indicating the connections between the check nodes $CN_i$ and the information nodes $IN_i$, and between the check nodes $CN_i$ and the parity nodes $PN_i$.

The implementation of $E_{IN}$ is the challenging part, since this connectivity (permutation $\Pi$) changes for each code rate R. The realization of $E_{PN}$ is straightforward, thus we focus on the mapping of the information nodes $IN_i$ and the check nodes $CN_i$. Due to the varying node degree, the processing units process all incoming messages in a serial manner. A processing unit can produce at most one updated message per clock cycle.

According to the equation 1, the connectivity of 360 edges of distinct information nodes are determined just by one value x, while q is a code rate dependent constant (FIG. 4). These 360 edges can be processed simultaneously by P=360 processing units. Within a half iteration, a processing unit has to process q(k−2) edges. The value (k−2) is the number of edges between one check node and information nodes. To simplify the node mapping, the code rate q has been chosen to satisfy the equation: $E_{IN}/360=q(k-2)$. That permits that each processing unit has to process the same amount of nodes which simplifies the node mapping.

Always 360 consecutive variable nodes are mapped to 360 processing units. To each processing unit $PU_i$, a main memory bank $MMB_i$ is associated to hold the corresponding messages (edges). The messages generally correspond to LLRs. For an information node of degree b, b storage places are allocated to this information node, because each incident edge has to be stored. Although the memory banks and the processing units have been functionally separated (for the information nodes and the check nodes). On FIG. 3, they are practically realized by the same hardware as it will be explained thereafter with reference to FIG. 5.

The check node mapping depends on the rate dependant factor q. For a code rate=1/2, q=90, so 90 check nodes are mapped to the first processing unit $PU_0$. The next 90 check nodes are mapped to the second processing unit $PU_1$, and so on. Again, the check node number corresponds to check node degree storage locations. This orthogonal mapping enables to use a simple shuffling network to provide the connectivity of the tanner graph. The shuffling network ensures that at each cycle 360 input messages are shuffled to 360 distinct memory banks. Thus $E_{IN}/360=162000/360=450$ shuffling and addressing information have to be stored at each cycle as shown on FIG. 4 (Addr). The shuffling offsets or shift values and addresses can be extracted from the tables B1 to B11 provided by the DVB-S2 standard.

Generally, the skilled artisan is able to define a shuffling network and its associated shift values from a Tanner graph of a LDPC code. For example, the skilled artisan can refer to the method disclosed in the document "Design Methodology for IRA Codes" by F. Kienle and N. Wehn (Proc. 2004 Asia South Pacific Design Automation Conference, Yokohama, Japan, January 2004).

Figure 5:
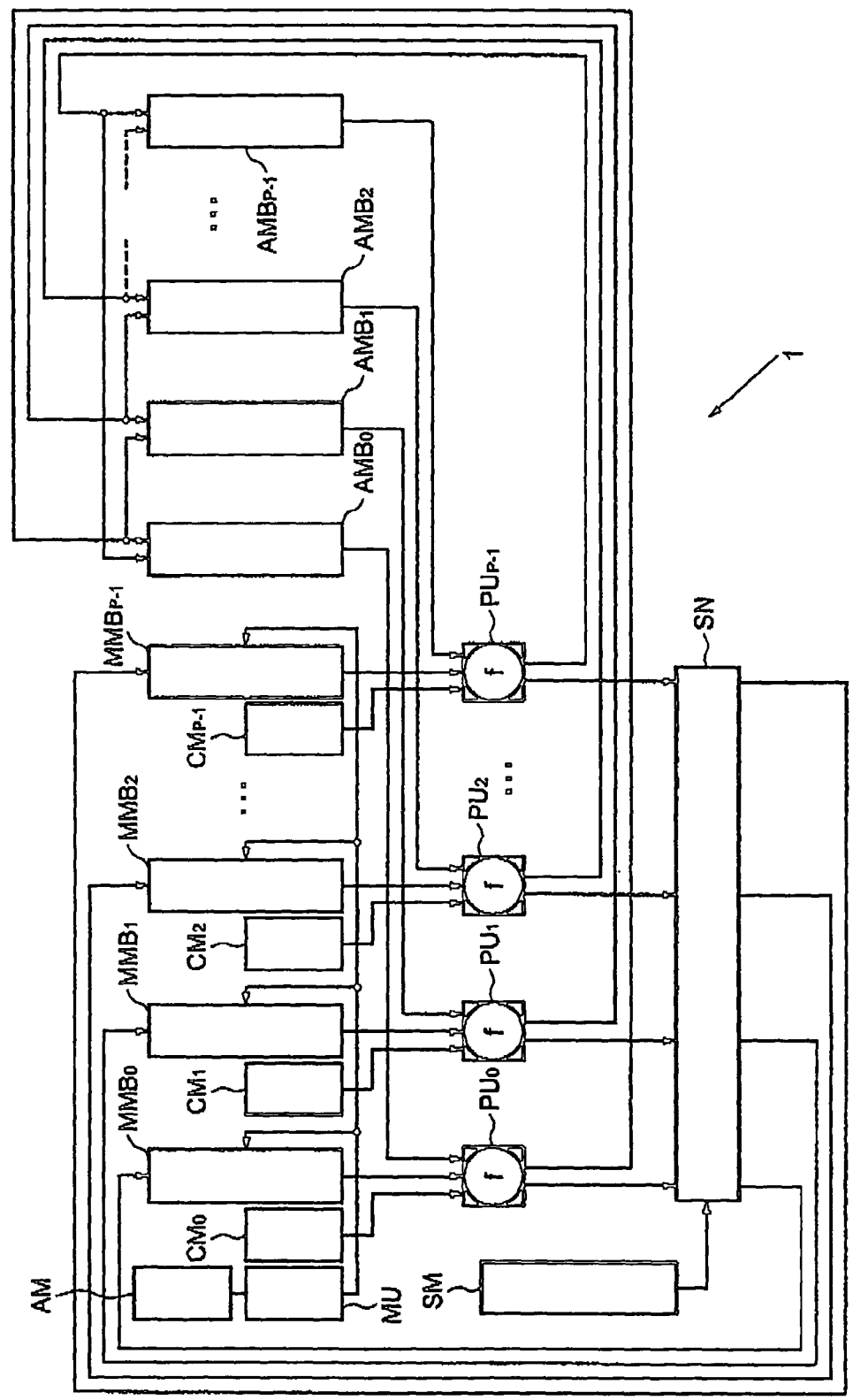
FIG. 5 is a diagram illustrating an embodiment of a LDPC decoder according to the invention.
Figure 7:
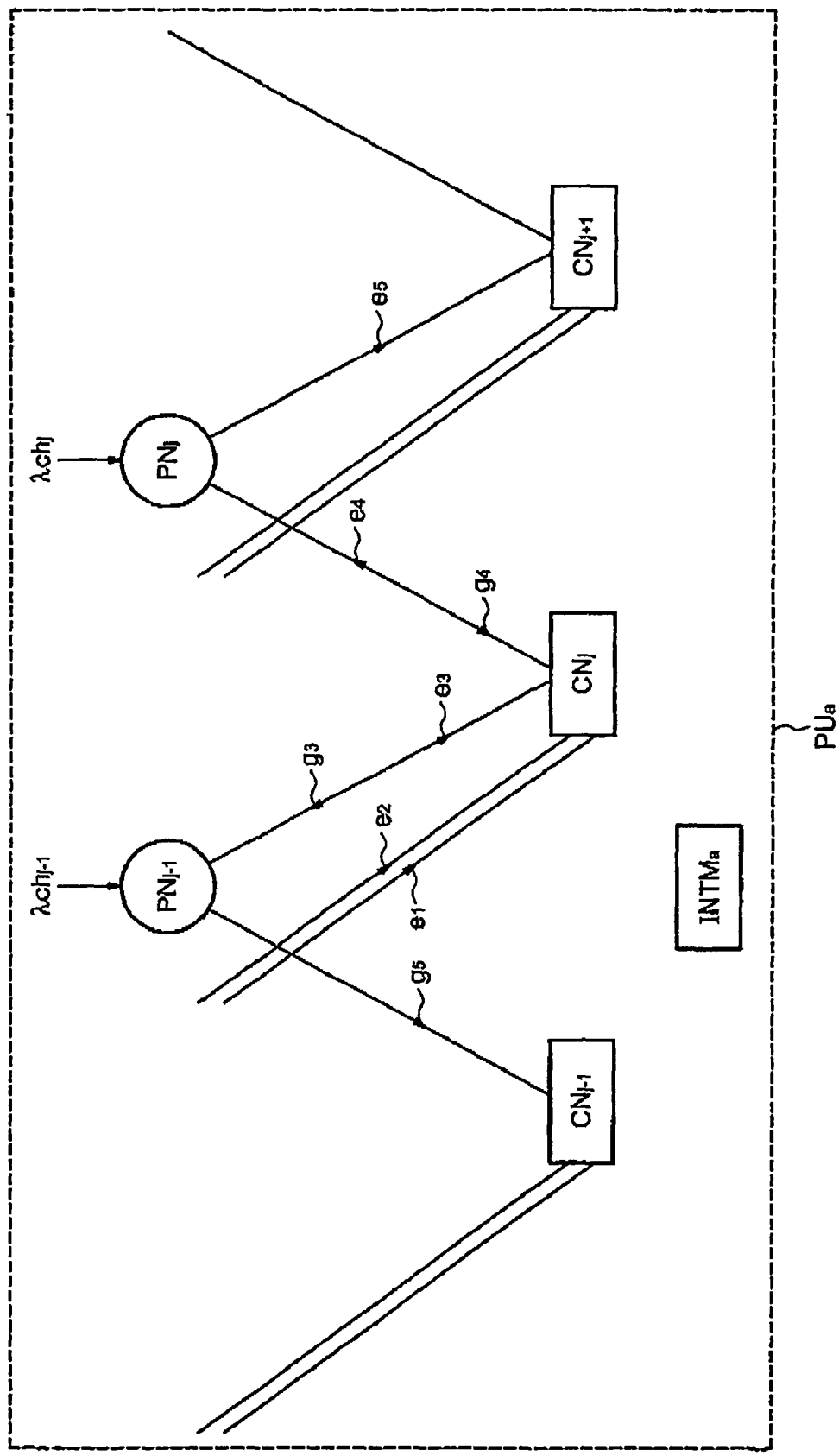
FIG. 7 is a diagram illustrating an update scheme related to the parity nodes used by a decoder according to the invention.

In FIG. 5, an embodiment of a decoder 1, with a partly parallel architecture, is depicted. The decoder 1 comprises P processing units $PU_0, PU_1, \ldots PU_{P-1}$, for updating messages exchanged iteratively between variable nodes $VN_i$ and check nodes $CN_i$ of a bipartite graph of the LDPC code. The bipartite graph is illustrated in FIGS. 1 and 7. The bipartite graph comprises a subset of first variable nodes, which are the information nodes $IN_i$, and a subset of second variable nodes, which are parity nodes $PN_i$.

The processing units perform iteratively an information nodes processing phase for updating all the messages from the information nodes to the check nodes and a check nodes processing phase for updating all the messages from the check nodes to the information nodes. The decoder 1 further comprises P channel memories $CM_0, CM_1, \ldots, CM_{P-1}$, P main memory banks $MMB_0, MMB_1, \ldots, MMB_{P-1}$, and P auxiliary memory banks $AMB_0, AMB_1, \ldots, AMB_{P-1}$ respectively associated to the P processing units $PU_0, PU_1, \ldots PU_{P-1}$.

The P main memory banks are adapted to store all the updated messages exchanged between the check nodes and the information nodes. The P channel memories are adapted to store all the digital data (soft bits or LLR) of the received codeword. The P auxiliary memories are adapted to store backward updated messages related to the parity nodes, as it will be explained more in detail thereafter.

A shuffling or shifting network SN is connected between the outputs of the processing units $PU_i$ and the main memory banks $MMB_i$. A shift memory SM is associated to the shuffling network SN and the shift values stored in the shift memory SM correspond to the connectivity between the information nodes $IN_i$ and the check nodes $CN_i$ of the bipartite graph of the LDPC code. Thus for a given shift value, all the P inputs of the shuffling network SN are connected the P outputs of the shuffling network SN having ranks shifted with respect to the corresponding ranks of the inputs, by the shift value.

The decoder 1 also comprises a management unit MU connected to the main memory banks $MMB_i$, and an address memory AM for storing a predetermined addressing scheme used for the processing of the check nodes $CN_i$ by the processing units $PU_i$. The processing units $PU_i$ are also respectively directly connected to the auxiliary memory banks $AMB_i$ (i.e. without passing through the shuffling network). The information nodes $IN_i$ and the check nodes $CN_i$ are respectively mapped horizontally and vertically on the processing units $PU_i$.

The decoder processes P nodes, here P=360, in parallel, so 360 messages are provided per cycle of the clock signal clocking this architecture. All the P messages are read from the same address from the main memory banks $MMB_i$. Though, for the information nodes processing phase the reading address is just incremented. A processing unit can accept new data at each clock cycle, while a control flag just labels the last message belonging to a node and starts the output processing. The newly produced P messages are then written back to the same address location, but with a cyclic shift due to the shuffling network SN.

To process the check nodes, it may be necessary to read from dedicated addresses, provided by the address memory AM. These addresses were extracted from node mapping as previously described. More precisely, the addressing scheme stored in the address memory AM has been predetermined for example by simulation taking into account the shift values respectively associated to the edges of the graph, and the internal structure of the main memory banks (size of the buffer, number of partitions) to avoid the access conflicts in the memory banks. Again, 360 messages are read per clock cycle and written back to the same address after the processing by the shuffling network SN. This ensures that the messages are shuffled back to their original position.

FIG. 3 illustrates an example of mapping, but this example is not the sole possible example. The rows of mapped information nodes can be permuted in comparison with those illustrated on FIG. 3, and processed during a half-iteration in the permuted row order. The result of decoding is identical, and the corresponding couples (shift value of SM, reading address of AM) are identical.

Figure 6:
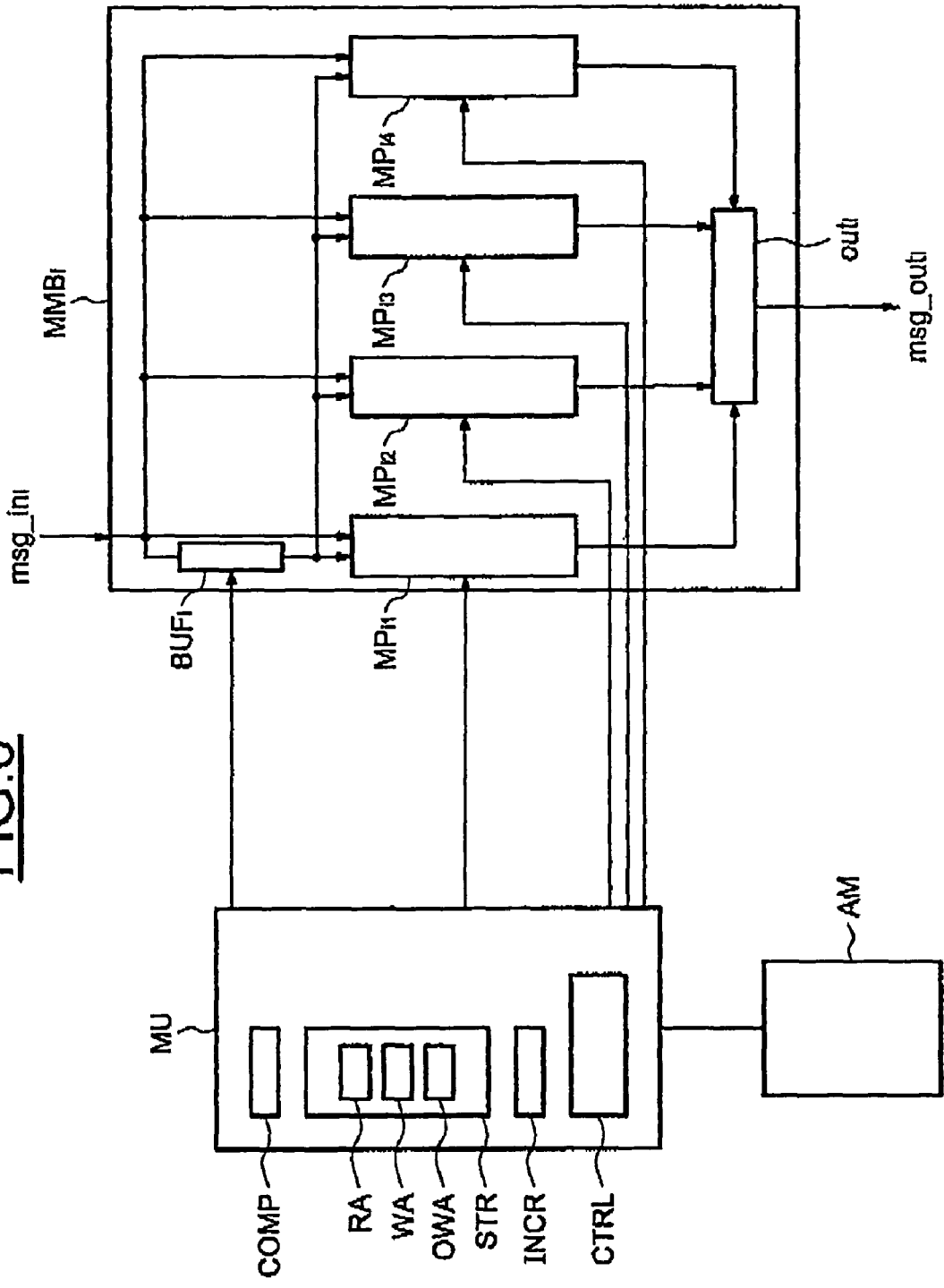
FIG. 6 is a diagram illustrating an embodiment of the management unit and of a main memory bank according to the invention.

In FIG. 6, the management unit MU and one of the P main memory banks are illustrated. The main memory bank $MMB_i$ comprises a buffer $BUF_i$, four single port memory partitions $MP_{i1}$, $MP_{i2}$, $MP_{i3}$, $MP_{i4}$, and a output module $OUT_i$ controlled by the management unit MU. Because each memory partition is a single port SRAM, it is impossible to read and write a data within a same clock cycle. Only a writing operation or a reading operation is possible within a clock cycle, increasing theoretically the risks of access conflicts. However, the structure of the main memory banks $MMB_i$ the management unit MU as well as the content of the address memory AM and of the shift memory SM contribute to avoid such risks, as it will be explained more in details.

The management unit MU further comprises a comparison module COMP, a storing module STR, comprising a memory area RA for storing a reading address RA, a memory area WA for storing a writing address WA, and a memory area OWA for storing an "old" writing address OWA. The management unit MU receives, within a clock cycle, a current reading address RA destined to the P main memory banks $MMB_i$ for respectively reading at the reading address P output messages. This current reading address is extracted from the address memory AM and is the same for all the P main memory banks.

The management unit MU receives also, within the same clock cycle, a current writing address WA destined to the P main memory banks $MMB_i$ for respectively storing at the writing address P updated messages. This current writing address is also extracted from the address memory AM and corresponds in fact to a previous reading address which has been extracted from the address memory AM during a previous clock cycle. Each of the current writing and the current reading address comprises an assignment indication to a memory partition $MP_i$ and an address indication within the memory partition $MP_i$. For example the assignment indication are the two last bits of the extracted address.

The comparison module COMP compares the current writing address WA and the current reading address RA. If assignment indications of both current reading and writing addresses are identical, the control module CTRL writes the input message $msg\_in_i$ into the buffer $BUF_i$ and transfers the current writing address WA into the memory area OWA. If such an input message $msg\_in_i$ has been bufferized within a preceding clock cycle, the control module CTRL writes the input message $msg\_in_i$ from the buffer $BUF_i$ to the corresponding memory partition at the "old" writing address stored in the memory area OWA, within a next clock cycle during which the corresponding memory partition is not read.

If assignment indications of both current reading and writing addresses RA and WA are different, the control module CTRL writes the input message msg_in into the corresponding single port memory partition at the corresponding address in said single port memory partition. The control module CTRL also controls the output modules $OUT_i$, for outputting of the main memory banks $MMB_i$ output messages $msg\_out_i$ stored at the reading address RA within the designated partition.

Although at least two partitions and one buffer with an appropriate size are necessary for reducing RAM access conflicts, it is possible by simulation to find the best addressing scheme stored in the address memory AM to minimize the buffer $BUF_i$ overhead. For example, it is possible to use one buffer capable of storing only one message and four partitions per main memory bank, for processing all code rates without access conflicts.

Referring now more particularly to FIG. 7, the update scheme related to the parity nodes is explained in more detail. In this example, a part of the zigzag configuration is represented, with three consecutive check nodes $CN_{j-1}, CN_j, CN_{j+1}$ and two consecutive parity nodes $PN_{j-1}, PN_j$. Edges between these three consecutive check nodes $CN_{j-1}$, $CN_j$, $CN_{j+1}$ and information nodes are represented. Furthermore, the LLR of the corresponding channel $\lambda ch_{j-1}, \lambda ch_j$ of the two successive parity nodes $PN_{j-1}, PN_j$ are represented.

During a clock cycle k, a processing unit $PU_a$ processes the check node $CN_j$, and calculates the message $e_4$ from the check node $CN_j$ to the parity node $PN_{j+1}$, as a function of $e_1$, $e_2$, and $e_3$: $e_4 = f(e_1, e_2, e_3)$, with $e_1$ and $e_2$ being the messages from the information nodes to the check node $CN_j$. The messages $e_1$ and $e_2$ are read from at least one main memory bank $MMB_i$.

The message $e_3$ has been calculated in the processing unit $PU_a$ during the precedent check node processing $CN_{j-}$, and kept in an internal memory $INTM_a$ of the processing unit $PU_a$, due to the zigzag configuration, as it will be explained more in details for the message $e_5$. The message $e_5$ from the parity node $PN_j$ to the next check node $CN_{j+1}$ is simply calculated by adding $e_4$ and the channel value $\lambda ch_j$, present in the corresponding channel memory $CM_a$ and corresponding to the parity node $PN_j$: $e_5=e_4+\lambda ch_j$. So, the message $e_5$ is kept in the internal memory $INTM_a$ of the processing unit $PU_a$ for the next processing which is the process of the next check node $CN_{j+1}$. Thus, the processing unit $PU_a$ performs a forward update for directly updating a message from a current check node to the following check node and stores the updated message $e_5$ in the internal memory $INTM_a$.

In a next clock cycle, the message $g_3$ from the check node $CN_j$ to the parity node $PN_{j-1}$ is calculated by the processing unit $PU_a$ ($g_3=f(e_1,e_2,g_4)$, with $g_4$ being the message from the parity node $PN_j$ to the check node $CN_j$, stored in an auxiliary memory bank). The message $g_5$ from the parity node $PN_{j-1}$ to the check node $CN_{j-1}$ is then directly simply calculated by adding message $g_3$ and the LLR value $\lambda ch_{j-1}$ corresponding to the parity node $PN_{j-1}$ and contained in the corresponding channel memory ($g_5=g_4+\lambda ch_{j-1}$). The message $g_5$ is then stored in the corresponding auxiliary memory bank.

The vertical mapping of the check nodes $CN_i$ on the processing units $PU_i$ permits to store less messages in the auxiliary memory banks because only the backward updated messages ($g_4, g_5, \ldots$) have to be stored in the auxiliary memory banks $AMB_i$. Each auxiliary memory bank may comprise for example two RAMs, one RAM for the writing operation and one RAM for the reading operation, or dual port RAMs.

The LDPC decoder 1 may be incorporated in a receiver TP (FIG. 8) of a wireless communication system, for example a DVB-S2 receiver receiving encoded codewords through a satellite channel, and comprising other conventional components as for example a demodulator DMD.

That which is claimed is:

1. A method for decoding a Low-Density Parity-Check (LDPC) encoded codeword, the LDPC code being represented by a bipartite graph between check nodes and variable nodes including first variable nodes, the method comprising:
    mapping the variable nodes and the check nodes on a partly parallel architecture clocked by a clock signal and including
        P processing units which update messages exchanged iteratively between the first variable nodes and check nodes through a shifting network controlled by shift values, and
        P main memory banks respectively associated with the P processing units, each main memory bank comprising at least two single port memory partitions and a buffer;
    updating messages including reading messages to be updated from P main memory banks at reading addresses and writing the updated messages at the same addresses and in view of the shift values; and
    within a same clock cycle and for each main memory bank, the updating further comprises reading and writing into two different memory partitions, or reading one memory partition and writing into the buffer.

2. The method according to claim 1, wherein the variable nodes further include second variable nodes of degree two connected to the check nodes via a zigzag connectivity; and wherein the updating further includes a first variable processing phase during which the messages from the first variable nodes to the check nodes are updated, and a check nodes processing phase during which the messages from the check nodes to the first variable nodes are updated, the messages from the second variable nodes to the check nodes are further updated, and during which an updated message processed by a check node is directly passed to the next check node through the zigzag connectivity.

3. The method according to claim 2, wherein a group of consecutive check nodes are processed by a same processing unit, and directly passing an updated message processed by a check node to the next check node through the zigzag connectivity includes storing the updated message into an internal memory of the processing unit.

4. The method according to claim 3, wherein the bipartite graph of the LDPC code includes information nodes defining the first variable nodes, and parity nodes as second variable nodes.

5. The method according to claim 1, wherein the LDPC code comprises an Irregular Repeat-Accumulate (IRA) code.

6. The method according to claim 5, wherein the LDPC code comprises a Digital Video Broadcast (DVB-S2) LDPC code.

7. A Low-Density Parity-Check (LDPC) decoder using an LDPC code represented by a bipartite graph between check nodes and variable nodes including first variable nodes, the LDPC decoder comprising:
    an input for receiving an encoded codeword including digital data;
    a processor for updating messages exchanged iteratively between the variable nodes and check nodes;
    a memory for storing the messages; and
    a shifting network connected between the processor and the memory and including a shift memory, the shifting network being controlled by shift values stored in the shift memory and corresponding to connectivity between the first variable nodes and the check nodes;
    the processor comprising P processing units configured to perform iteratively a first variable nodes processing phase for updating the messages from the first variable nodes to the check nodes, and a check nodes processing phase for updating the messages from the check nodes to the first variable nodes;
    the first variable nodes and check nodes being mapped on the P processing units according to two orthogonal directions;
    the input comprising P channel memories for storing the digital data of the codeword;
    the memory comprising P main memory banks associated with the P processing units for storing the messages iteratively exchanged between the first variable nodes and the check nodes, each main memory bank comprising at least two single port memory partitions and a buffer; and
    a memory controller for reading a message from and writing the corresponding updated message into the memory at a same address and in view of the shift values, and for, within a same clock cycle and for each main memory bank, reading and writing into two different memory partitions or reading one memory partition and writing into the buffer.

8. The decoder according to claim 7, wherein the memory controller comprises a management unit connected to the P main memory banks for receiving, within a clock cycle, a current reading address for the P main memory banks for respectively reading, at the reading address, P output messages, and a current writing address for the P main memory banks for respectively storing, at the writing address, P updated messages, each of the current writing and the current reading addresses comprising an assignment indication to a memory partition and an address indication within the memory partition.

9. The decoder according to claim 8, wherein the management unit comprises:
a storage unit;
a comparison unit for comparing the current writing address and the current reading address;
a control unit for writing the input message into the buffer of the main memory bank and delivering the current writing address to the storage unit if assignment indications of both current reading and writing addresses are identical, and the control unit being configured to write the input message from the buffer into the corresponding memory partition at the current writing address within a next clock cycle during which the corresponding memory partition is not read.

10. The decoder according to claim 8, wherein the memory controller comprises:
an incrementing unit for successively incrementing the reading and writing addresses to be used in the first variable nodes processing phase; and
an address memory for storing an addressing scheme corresponding to the writing and reading addresses to be used in the check nodes processing phase.

11. The decoder according to claim 7, wherein each main memory bank comprises one buffer for storing only one message, and four memory partitions.

12. The decoder according to claim 7, wherein the first variable nodes are mapped horizontally on the P processing units, the P processing units being configured to update the messages in the first variable nodes processing phase, by successive groups of P messages respectively related to P consecutive first variable nodes; and wherein the check nodes are mapped vertically on the P processing units, at least one processing unit being configured to update, in the check nodes processing phase, the messages related to P consecutive check nodes.

13. The decoder according to claim 12, wherein the variable nodes of the variable nodes of the bipartite graph further include second variable nodes of degree two, connected to the check nodes in a fixed zigzag connectivity; and wherein the P processing units are configured to update the messages from the second variable nodes to the check nodes in the check nodes processing phase.

14. The decoder according to claim 13, further comprising P auxiliary memory banks associated with the P processing units and directly connected between outputs and inputs of the processing units; wherein in the check nodes processing phase each processing unit is configured to read at least one main memory bank and the corresponding channel memory for performing a forward update for directly updating a message from a current check node to a following check node and to store the updated message in the processing unit, and is configured to read one auxiliary memory bank, the corresponding channel memory and at least one main memory bank for performing a backward update of a message from a second variable node to a preceding check node and to write the updated message in one auxiliary memory bank.

15. The decoder according to claim 7, wherein the digital data of the codeword and the messages are Log-Likelihood Ratios (LLR).

16. The decoder according to claim 15, wherein the bipartite graph of the LDPC code comprises information nodes defining the first variable nodes, and parity nodes as second variable nodes.

17. The decoder according to claim 16, wherein the LDPC code is an Irregular Repeat-Accumulate (IRA) code.

18. The decoder according to claim 17, wherein the LDPC code is a Digital Video Broadcast (DVB-S2) LDPC code.

19. A wireless receiver of a wireless communication system, the receiver comprising:
a Low-Density Parity-Check (LDPC) decoder using an LDPC code represented by a bipartite graph between check nodes and variable nodes including first variable nodes, the LDPC decoder including
an input for receiving an encoded codeword including digital data,
a processor for updating messages exchanged iteratively between the variable nodes and check nodes,
a memory for storing the messages, and
a shifting network connected between the processor and the memory and including a shift memory, the shifting network being controlled by shift values stored in the shift memory and corresponding to connectivity between the first variable nodes and the check nodes,
the processor comprising P processing units configured to perform iteratively a first variable nodes processing phase for updating the messages from the first variable nodes to the check nodes, and a check nodes processing phase for updating the messages from the check nodes to the first variable nodes,
the first variable nodes and check nodes being mapped on the P processing units according to two orthogonal directions,
the input comprising P channel memories for storing the digital data of the codeword,
the memory comprising P main memory banks associated with the P processing units for storing the messages iteratively exchanged between the first variable nodes and the check nodes, each main memory bank comprising at least two single port memory partitions and a buffer, and
a memory controller for reading a message from and writing the corresponding updated message into the memory at a same address and in view of the shift values, and for, within a same clock cycle and for each main memory bank, reading and writing into two different memory partitions or reading one memory partition and writing into the buffer.

20. The wireless receiver according to claim 19, wherein the memory controller comprises a management unit connected to the P main memory banks for receiving, within a clock cycle, a current reading address for the P main memory banks for respectively reading, at the reading address, P output messages, and a current writing address for the P main memory banks for respectively storing, at the writing address, P updated messages, each of the current writing and the current reading addresses comprising an assignment indication to a memory partition and an address indication within the memory partition.

21. The wireless receiver according to claim 20, wherein the management unit comprises:
a storage unit;
a comparison unit for comparing the current writing address and the current reading address;
a control unit for writing the input message into the buffer of the main memory bank and delivering the current writing address to the storage unit if assignment indications of both current reading and writing addresses are identical, and the control unit being configured to write the input message from the buffer into the corresponding memory partition at the current writing address within a next clock cycle during which the corresponding memory partition is not read.

* * * * *

UNITED STATES PATENT AND TRADEMARK OFFICE
CERTIFICATE OF CORRECTION

| | | |
|---|---|---|
| PATENT NO. | : 7,774,674 B2 | Page 1 of 1 |
| APPLICATION NO. | : 11/366167 | |
| DATED | : August 10, 2010 | |
| INVENTOR(S) | : Wehn et al. | |

It is certified that error appears in the above-identified patent and that said Letters Patent is hereby corrected as shown below:

| | |
|---|---|
| Title Page, Section 73 | Delete: "stmicroelectronics" <br> Insert: -- STMicroelectronics -- |
| Title Page, Section 57, Line 12 | Delete: "buffer the" <br> Insert: -- buffer. The -- |
| Column 6, Line 32 | Delete: "J, $f_1$, $f_3$" <br> Insert: -- J, $f_j$, $f_3$ -- |
| Column 7, Line 57 | Delete: "EIN and EPN" <br> Insert: -- $E_{IN}$ and $E_{PN}$ -- |
| Column 9, Line 10 | Delete: "connected the P" <br> Insert: -- connected to the P -- |
| Column 10, Line 22 | Delete: "tion are the" <br> Insert: -- tion is the -- |
| Column 11, Line 2 | Delete: "$CN_{j-}$," <br> Insert: -- $CN_{j-1}$, -- |
| Column 14, Line 3, Claim 19 | Delete: "using an" <br> Insert: -- using a -- |

Signed and Sealed this

Fifteenth Day of February, 2011

David J. Kappos
*Director of the United States Patent and Trademark Office*